United States Patent
Yang et al.

(10) Patent No.: US 11,705,421 B2
(45) Date of Patent: Jul. 18, 2023

(54) APPARATUS INCLUDING SOLDER-CORE CONNECTORS AND METHODS OF MANUFACTURING THE SAME

(71) Applicant: Micron Technology, Inc., Boise, ID (US)

(72) Inventors: Po Chih Yang, Taichung (TW); Po Chen Kuo, Taichung (TW); Chih Hong Wang, Taichung (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/231,847

(22) Filed: Apr. 15, 2021

(65) Prior Publication Data
US 2022/0336397 A1    Oct. 20, 2022

(51) Int. Cl.
*H01L 23/00* (2006.01)
*H01L 23/488* (2006.01)
*H01L 23/532* (2006.01)

(52) U.S. Cl.
CPC ............ *H01L 24/14* (2013.01); *H01L 23/488* (2013.01); *H01L 23/53228* (2013.01)

(58) Field of Classification Search
CPC .. H01L 23/14; H01L 23/488; H01L 23/53228
See application file for complete search history.

(56) References Cited

U.S. PATENT DOCUMENTS

| | | | |
|---|---|---|---|
| 10,276,539 B1* | 4/2019 | Wirz | H01L 24/92 |
| 2002/0105074 A1* | 8/2002 | Akram | H01L 24/12 |
| | | | 257/E21.511 |
| 2012/0018875 A1* | 1/2012 | Yang | H01L 23/3171 |
| | | | 257/737 |
| 2019/0027453 A1* | 1/2019 | Kim | H01L 23/3157 |
| 2021/0272921 A1* | 9/2021 | Arifeen | H01L 24/05 |

* cited by examiner

*Primary Examiner* — Peniel M Gumedzoe
(74) *Attorney, Agent, or Firm* — Perkins Coie LLP

(57) ABSTRACT

Semiconductor devices including continuous-core connectors and associated systems and methods are disclosed herein. The continuous-core connectors each include a peripheral wall that surrounds an inner-core configured to provide an electrical path using uniform material.

20 Claims, 9 Drawing Sheets

...

APPARATUS INCLUDING SOLDER-CORE CONNECTORS AND METHODS OF MANUFACTURING THE SAME

TECHNICAL FIELD

The present technology is directed to apparatuses, such as semiconductor devices including memory and processors, and several embodiments are directed to semiconductor devices that include solder-core connectors.

BACKGROUND

The current trend in semiconductor fabrication is to manufacture smaller and faster devices with a higher density of components for computers, cell phones, pagers, personal digital assistants, and many other products. However, decrease in circuit size can lead to changes or weaknesses in structural integrity. For example, structures in the fabricated semiconductor device may delaminate and/or crack due to stress, temperature fluctuations, and/or mismatches in the coefficient of thermal expansion (CTE) for the corresponding materials of the structures in the device.

DETAILED DESCRIPTION

Figure 1A:
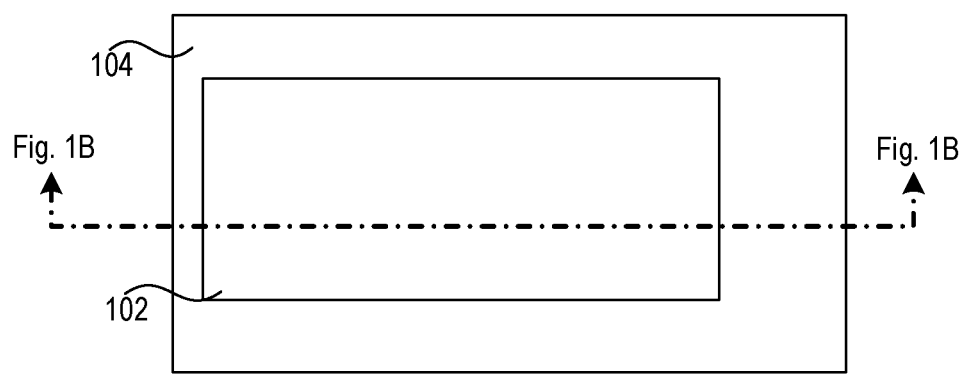
FIG. 1A is a top view of a semiconductor device.

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

Several embodiments of semiconductor devices, packages, and/or assemblies in accordance with the present technology can include one or more solder-core connectors configured to provide electrical connections to one or more external circuits. The solder-core connectors can include a continuous peripheral wall that extends away from a surface of a semiconductor device. The continuous peripheral wall (e.g., a cylinder) can include or define an inner space occupied or filled by a continuous or solid inner-core (e.g., solder). The inner-core can include uniform material and be configured to directly contact the semiconductor device and an external circuit. The inner-core can extend past a distal edge of the peripheral wall and away from the semiconductor device. In other words, the inner-core can include uniform metallic material configured to provide an electrical connection to or from the corresponding semiconductor device.

In some embodiments, the semiconductor device can include low dielectric (low K or LK) material to get higher electrical performance, such as to reduce resistor-capacitor (RC) delays, while maintaining threshold dimensional requirements to reduce the size of the device. For example, one or more embodiments may include one or more Extreme Low K (ELK) or Ultra Low K (ULK) structures (e.g., inter-layer dielectrics (ILDs)) within the wafer used to form the device. The LK or ELK structures may be susceptible to structural damages caused by stress and/or temperature changes (along with CTE differences in the materials) that occur during manufacturing/assembly and/or use. In some embodiments, the LK structures can have dielectric constant less than that of silicon dioxide (e.g., k<3.9), the ELK structures can have dielectric constant less than 2.5 (e.g., k<3.9), and/or the ULK structures can have dielectric constant around 2.2 or less (e.g., k<2.7).

By providing a continuous inner-core, the continuous-core connector can reduce the internal stress for the semiconductor device. Accordingly, the continuous-core connector can provide reduced failure rates, such as for reducing the structural failures in the LK structures. The continuous-core connector can remove modulus structures (e.g., by removing copper or other intervening metallic structures/pillars between solder and the corresponding device) that have mismatching capacity to absorb stress. Accordingly, the continuous-core connector can improve stress integration between the connector and the device (e.g., the LK structure therein) and reduce likelihood of delamination and cracks forming in the device.

Figure 1B:
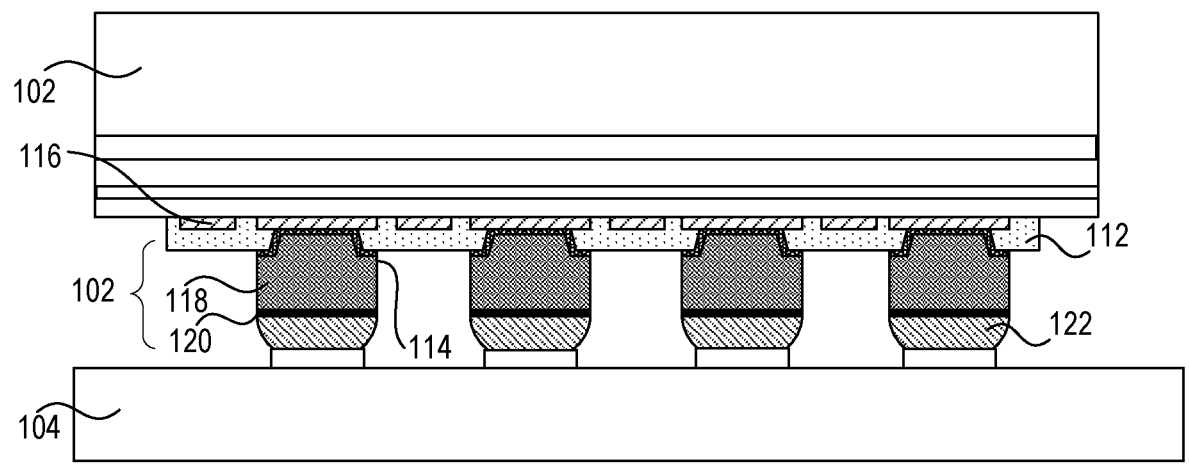
FIG. 1B is a schematic cross-sectional view of the semiconductor device taken along a line 1B-1B of FIG. 1A.

FIG. 1A is a top view of a semiconductor device 102, and FIG. 1B is a schematic cross-sectional view of the device 102 taken along a line 1B-1B of FIG. 1A in accordance with embodiments of the technology. Referring to FIG. 1A and FIG. 1B together, the semiconductor device 102 (e.g., a semiconductor chip, such as a flip chip) can be attached over a substrate 104 (e.g., a printed circuit board (PCB) substrate). The semiconductor device 102 may be attached to the substrate 104 via one or more connectors, such as electrical connectors 106.

The semiconductor device 102 can include solder resist 112 with openings that include under-bump metallizations (UBMs) 114. The UBMs 114 can be electrically connected to a connection layer 116 (e.g., signal traces/planes) configured to route electrical signals, source voltages, and/or electrical grounds to/from circuit components. The UBMs 114 can serve as basis, foundations, and/or pads for the electrical connectors 106. For example, the electrical connectors 106 can each include a metallic pillar 118, such as a copper pillar, directly on or contacting the corresponding UBM 114. Each metallic pillar 118 can be connected to or have plated thereon an interface layer 120 (e.g., nickel plating layer). The interface layer 120 can be configured to facilitate bonding between the metallic pillar 118 and solder 122 (e.g., tin, silver, alloys, and/or other metallic material). The solder 122 can be used to connect to the substrate 104 or metallic pads thereon and provide structural and/or electrical connections between the semiconductor device 102 and the substrate 104.

As described above, the electrical connectors 106 can include different materials/layers (e.g., different metallic compositions) between the semiconductor device 102 and the substrate 104. In other words, the metallic composition of the electrical connectors 106 may vary along a direction extending from the semiconductor device 102 toward the substrate 104 (e.g., a direction of signal travel). As such, the varied compositional layers in the electrical connectors 106 can cause stress on the body of and/or the structures within the semiconductor device 102.

Figure 2A:
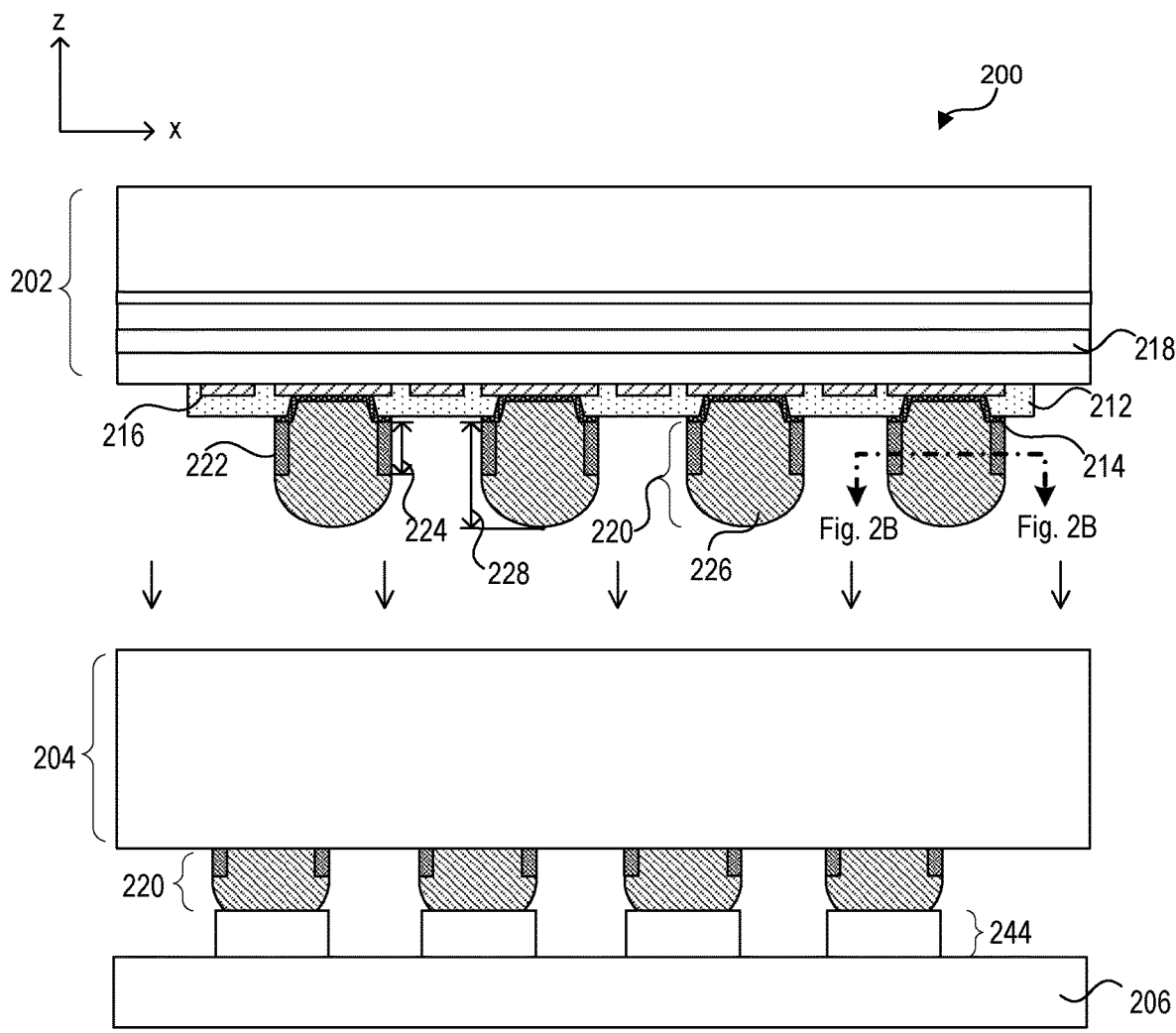
FIG. 2A is a schematic cross-sectional view of a semiconductor device in accordance with embodiments of the technology.
Figure 2B:
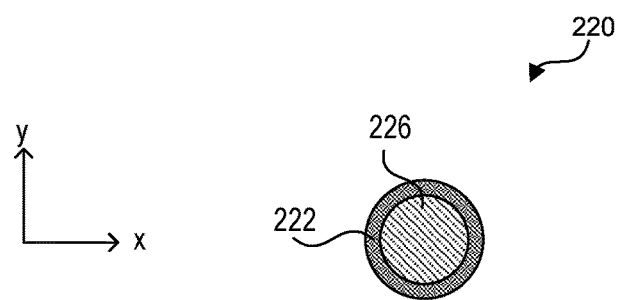
FIG. 2B is a schematic cross-sectional view of a connector taken along a line 2B-2B of FIG. 2B in accordance with embodiments of the technology.

FIG. 2A is a schematic cross-section of a semiconductor package 200, and FIG. 2B is a schematic cross-sectional view of a continuous-core connector 220 taken along a line 2B-2B of FIG. 2A in accordance with embodiments of the technology. The semiconductor package 200 can include a first semiconductor device 202, a second semiconductor device 204, and/or a substrate 206.

The first semiconductor device 202 (e.g., a semiconductor die, such as a flip chip) and/or the second semiconductor device 204 can be attached over the substrate 206 (e.g., a printed circuit board (PCB) substrate). The first semiconductor device 202 and/or the second semiconductor device 204 may be attached to each other and/or the substrate 206 via one or more sets of connectors, such as sets of the continuous-core connectors 220. The continuous-core connectors 220 can extend away from an interface surface of the corresponding semiconductor device 202 and/or 204 to connection interfaces or pads 244 on the connected device.

The semiconductor device 202 can include solder resist 212 with openings that include UBMs 214. The UBMs 214 can be electrically connected to a connection layer 216 (e.g., signal traces/planes) configured to route electrical signals, source voltages, and/or electrical grounds to/from circuit components. The UBMs 214 can serve as basis, foundations, and/or pads for the continuous-core connectors 220. In some embodiments, the semiconductor device 202 can include one or more LK structures or components 218, such as for ILDs.

The continuous-core connectors 220 can be configured to structurally and/or electrically connect the semiconductor device 202 to other external circuits and/or structures, such as the second semiconductor device 204 and/or the substrate 206. Each of the continuous-core connectors 220 can include a peripheral wall 222 surrounding an inner-core 226. The peripheral wall 222 can surround, encircle, and/or define an inner area along a lateral plane (e.g., x-y plane) and extend along a vertical direction (e.g., along a z-axis) away from a surface of the first semiconductor device 202 by a wall height 224. The inner-core 226 can be within or occupy the inner area and extend along the vertical direction away from the surface by a core height 228 (e.g., a dimension for a portion of the inner-core 226 protruding over (e.g., along the z-axis) a top surface of the first semiconductor device 202 (e.g., above the exposed surface of the solder resist 212 and/or the UBM 214)). The core height 228 can be greater than the wall height 224. Accordingly, the inner-core 226 can extend away from the surface beyond distal portions of the peripheral wall 222.

The peripheral wall 222 can be rigid or inflexible under operating conditions (e.g., under a temperature range that includes room temperature) to provide a physical separation between the first semiconductor device 202 and an attached structure. The wall height 224 can be associated with a minimum separation distance between the first semiconductor device 202 and the attached structure. In some embodiments, the peripheral wall 222 include electrically conductive material and function together with the inner-core 226 to provide an electrical path/connection.

In some embodiments, the peripheral wall 222 can include electrically conductive material (e.g., metallic material, such as copper, nickel, alloy, etc.). As an illustrative example, FIG. 2B shows the inner area as having a circular shape, such as for a cylinder. However, it is understood that the inner area can have different shapes, such as an oval and/or a polygon. In other embodiments, the peripheral wall 222 can include non-conductive material.

The inner-core 226 can be configured to provide electrical connection to/from the first semiconductor device 202 and include conductive material (e.g., metallic material). The inner-core 226 can include material different from the peripheral wall 222 and/or having lower melting point than the material in the peripheral wall 222. For example, the inner-core 226 can include solder (e.g., tin, silver, alloy, etc.). Accordingly, the inner-core 226 can reflow and directly contact/connect to the first semiconductor device 202 and the external structure (e.g., the second semiconductor device 204 and/or the substrate 206). The inner-core 226 can provide the electrical path to/from the first semiconductor device 202 and/or the structural connector that is uniform in material along the direction (e.g., along the z-axis) extending away from the corresponding surface of the first semiconductor device 202.

The continuous-core connectors 220 (e.g., the peripheral wall 222 and the inner-core 226 therein) can reduce the CTE differences in the connecting structures and/or improve the capacity to absorb mechanical stresses applied toward the first semiconductor device 202. Accordingly, the continuous-core connectors 220 can provide reduced the mechanical stress applied to the inner portions of the first semiconductor device 202 (e.g., the LK structure 218 therein) in comparison to the electrical connector 106 of FIG. 1B. Thus, the continuous-core connectors 220 can reduce failures in the first semiconductor device 202 (e.g., structural failures, such as cracks or delamination). Moreover, the continuous-core connectors 220 can improve the capacity to integrate and process thinner structures/layers and/or LK material and the reliability of the resulting device, thereby improving the chip packaging interaction (CPI). The CPI can correspond to the reliability issues (e.g., cracks in the LK structure 218) associated with die having LK (e.g., ULK) structures.

Additionally, the continuous-core connectors 220 can reduce the number of different types of materials and/or amounts thereof used to form the connectors, such as by eliminating the interface layer 120 of FIG. 1B (e.g., nickel) and/or by reducing the amount of metallic material (e.g., copper) used for the pillar 118 of FIG. 1B in comparison to the peripheral wall 222. The continuous-core connectors 220 can further improve the CPI.

FIG. 3-FIG. 14 are illustrations of phases for a manufacturing process in accordance with embodiments of the technology. The manufacturing process can be for manufacturing/processing the first semiconductor device 202 of FIG. 2A, the second semiconductor device 204 of FIG. 2A and/or the continuous-core connectors 220 of FIG. 2A.

Figure 3:
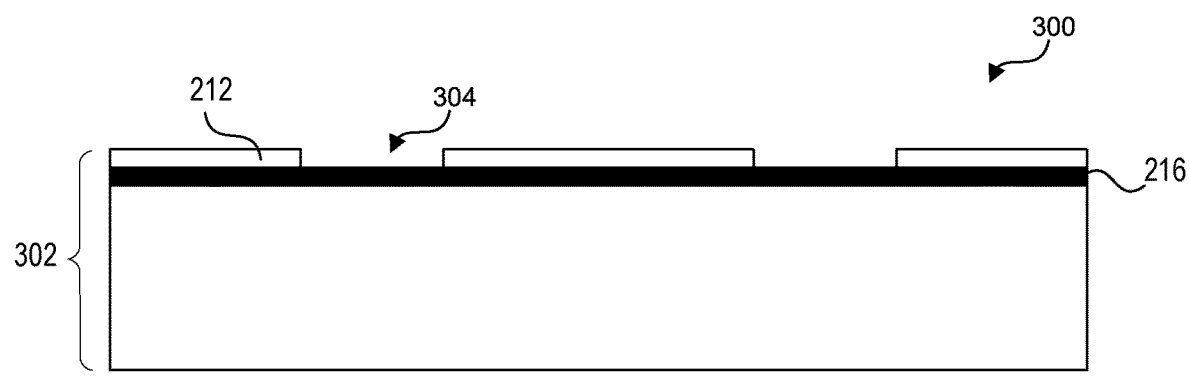
FIG. 3-FIG. 14 are illustrations of phases for a manufacturing process in accordance with embodiments of the technology.

FIG. 3 illustrates a phase 300 for providing a device substrate 302 (e.g., processed semiconductor structure). The device substrate 302 can include the connection layer 216 and/or circuitry components (e.g., integrated circuits (ICs) under the solder resist 212. The device substrate 302 can further include connector openings 304 in the solder resist 212, thereby exposing portions of the connection layer 216.

Figure 4:
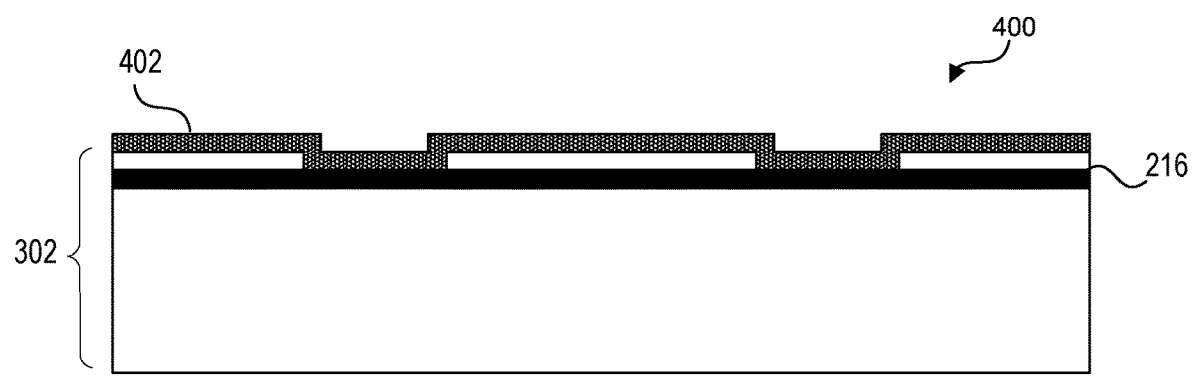

FIG. 4 illustrates a phase 400 for forming a seed layer 402 (e.g., metallic layer, such as a copper layer) over the device substrate 302. For example, the phase 400 can correspond to Physical Vapor Deposition (PVD). The seed layer 402 can be over the solder resist 212 and at least partially fill or occupy the connector openings 304. Accordingly, the seed layer can directly contact the connection layer 216 through or at the connector openings 304.

Figure 5:
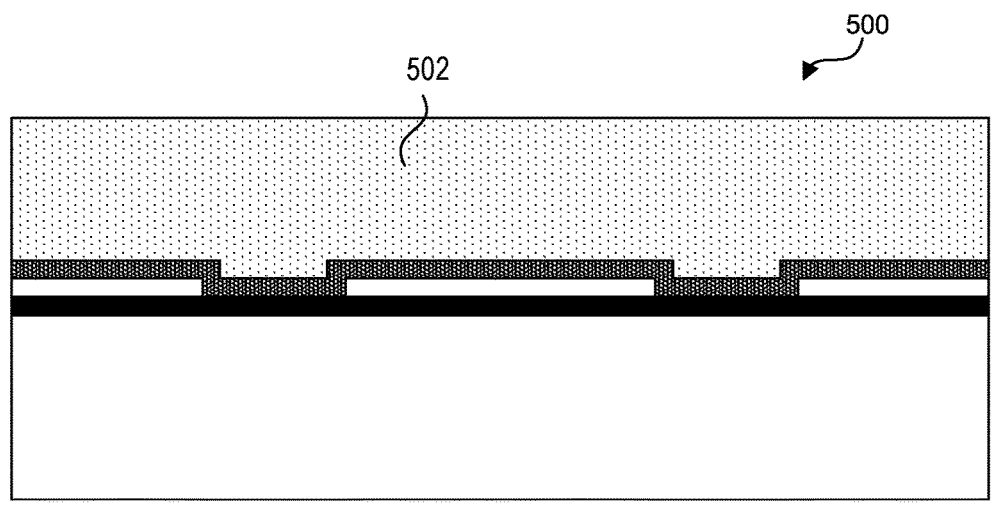

FIG. 5 illustrates a phase 500 for coating a first photoresist (PR) 502 over the seed layer 402. For example, the phase 500 can include a spin coating process that applies the first PR 502 on the seed layer 402. The first PR 502 can cover the seed layer 402 and/or fill the indentations therein over the filled connector openings 304.

Figure 6:
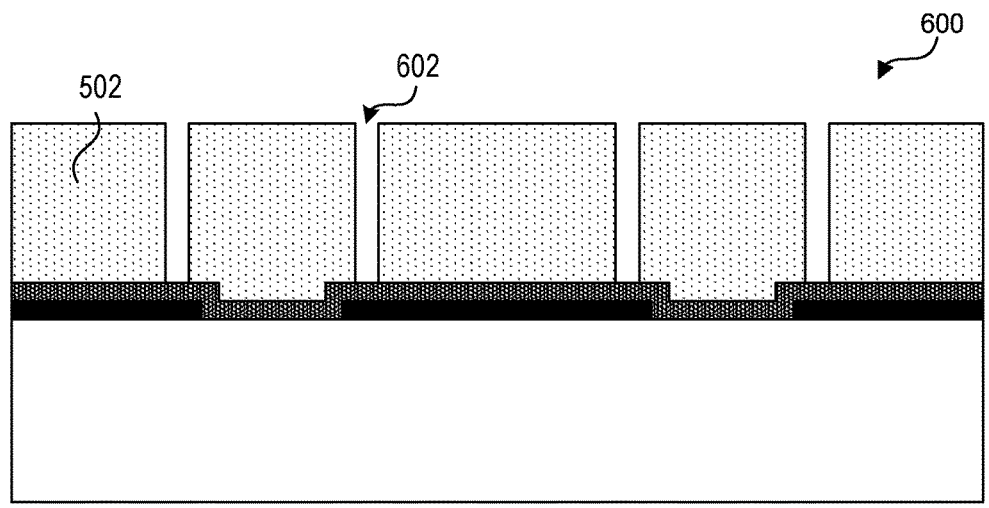

FIG. 6 illustrates a phase 600 for forming wall-forming openings 602 in the first PR 512. The wall-forming openings 602 can be created by shaping/removing portions of the first PR 512 (such as through an exposure process and/or a developing process) according to a predetermined cross-sectional shape, width, and/or location. The portions of the first PR 512 can be removed to expose the seed layer 402. In other words, the wall-forming openings 602 can extend through the first PR 502 and leave the corresponding portions of the seed layer 402 uncovered. The wall-forming openings 602 can be adjacent to and/or encircle the indentation in the seed layer 402.

Figure 7:
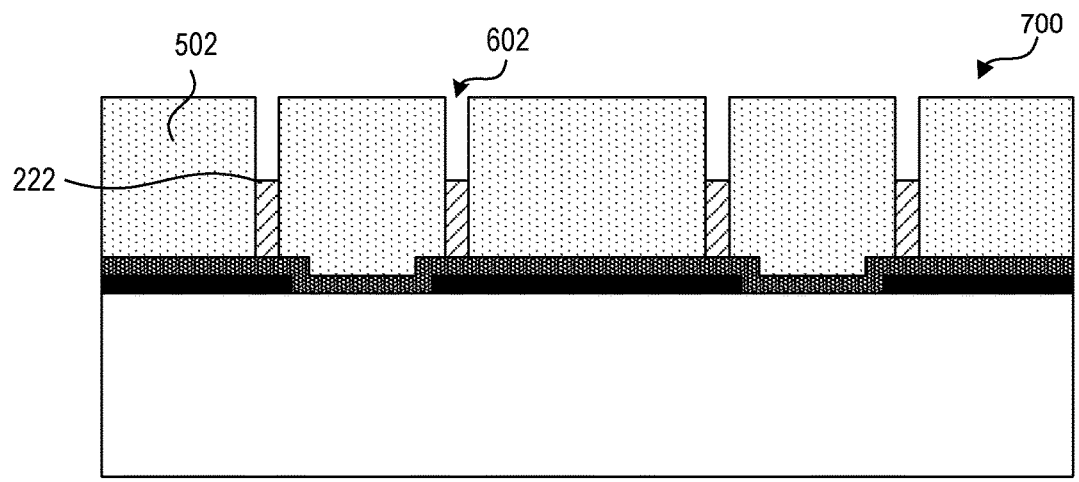

FIG. 7 illustrates a phase 700 for forming the peripheral walls 222. The peripheral walls 222 can be formed by depositing and/or plating conductive material in the wall-forming openings 602. The conductive material (e.g., metallic material, such as copper, nickel, alloy, etc.) can be deposited over and directly on/contacting the seed layer 402 within the wall-forming openings 602. The peripheral walls 222 can be formed having the wall height 224 of FIG. 2A as described above.

Figure 8:
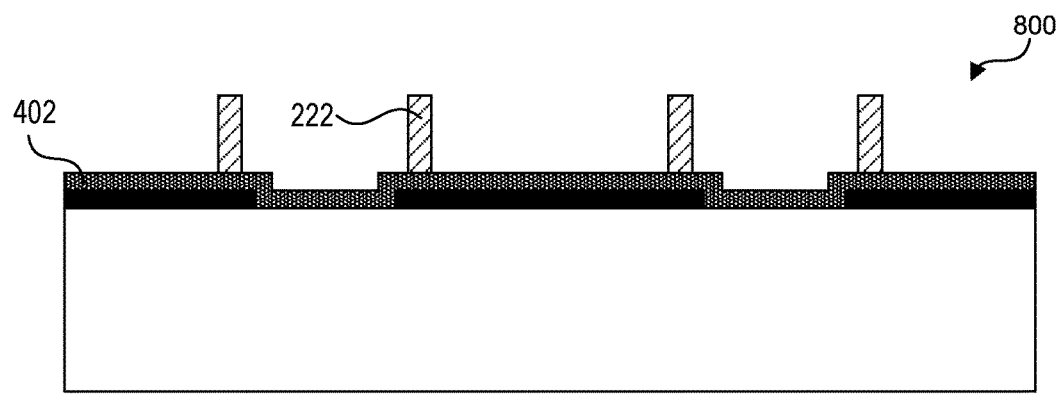

FIG. 8 illustrates a phase 800 for removing the first PR 502 of FIG. 7, such as via a wet etching process. Accordingly, the peripheral walls 222 and the seed layer 402 can be exposed.

Figure 9:
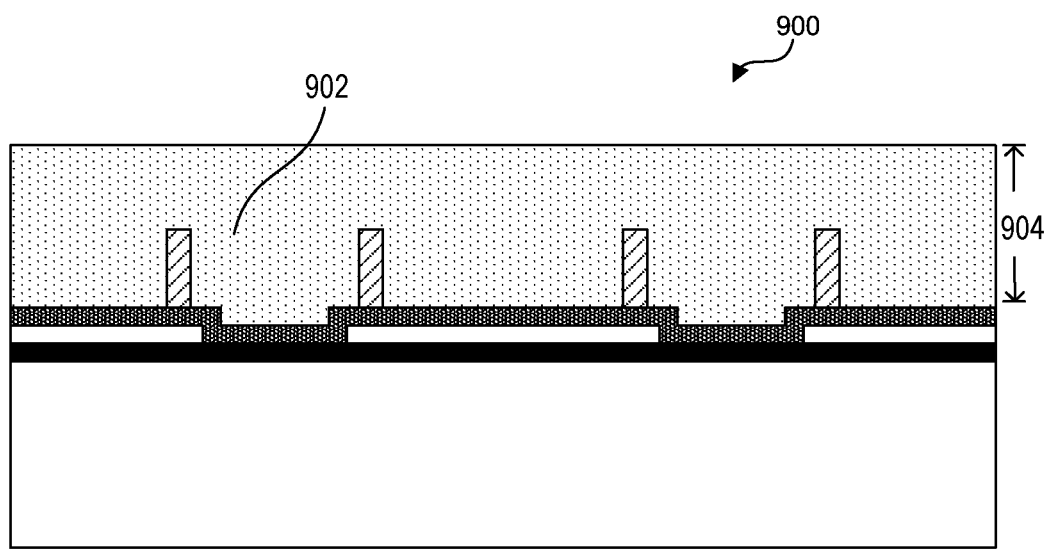

FIG. 9 illustrates a phase 900 for coating a second PR 902 over the seed layer 402 and the peripheral walls 222. The second PR 902 can be coated similarly as described above for phase 500. The second PR 902 can have a thickness 904 greater than the wall height 224 of FIG. 2A and/or associated with the core height 228 of FIG. 2A.

Figure 10:
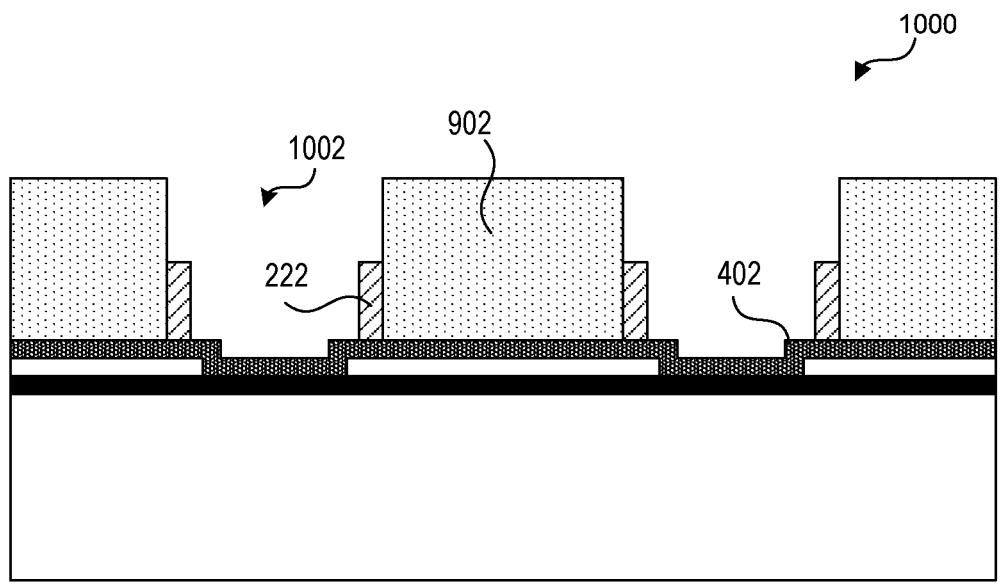

FIG. 10 illustrates a phase 1000 for forming core-forming openings 1002 in the second PR 902. The core-forming openings 1002 can be created by shaping/removing portions of the second PR 902 similarly as described above for phase 600. The core-forming openings 1002 can expose inner vertical surfaces of the peripheral walls 222, top portions of the peripheral walls 222, the seed layer 402 encircled/surrounded by the peripheral walls 222 (e.g., the indented portion over the previous connector openings 304), or a combination thereof. In some embodiments, the core-forming openings 1002 can be aligned with outer vertical surfaces of the peripheral walls 222. Alternatively or additionally, the core-forming openings 1002 can have a shape and/or a set of dimensions matching the cross-sectional shape of the peripheral walls 222. In other embodiments, the core-forming openings 1002 can be aligned with inner vertical surfaces of the peripheral walls 222, and the second PR 902 can cover top portions/surfaces of the peripheral walls 222.

Figure 11:
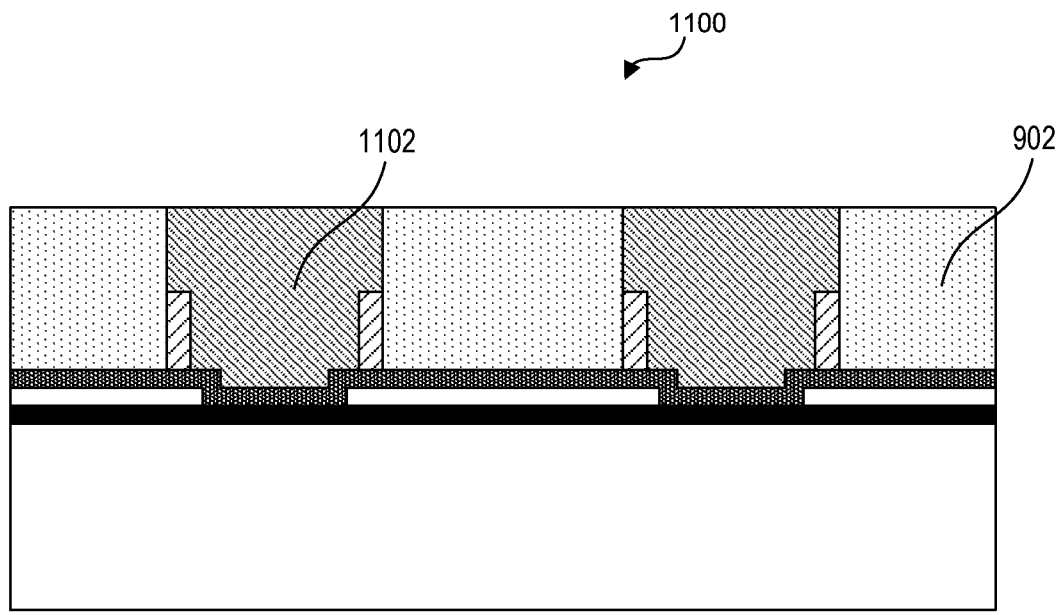

FIG. 11 illustrates a phase 1100 for forming the inner-core 226 of FIG. 2A. The inner-core 226 can be formed by depositing core material 1102 (e.g., tin, silver, alloy, etc.) in the core-forming openings 1002 of FIG. 10 and/or over the seed layer 402, such as by a plating process, a deposition process, etc. The deposited core material 1102 can directly contact the seed layer 402 previously exposed within the core-forming openings 1002. The core material 1102 can be deposited up to a top surface of the second PR 902. Accordingly, the deposited core material 1102 can be coplanar with the top surface of the second PR 902 and/or have a height matching the thickness 904 of the second PR 902.

Figure 12:
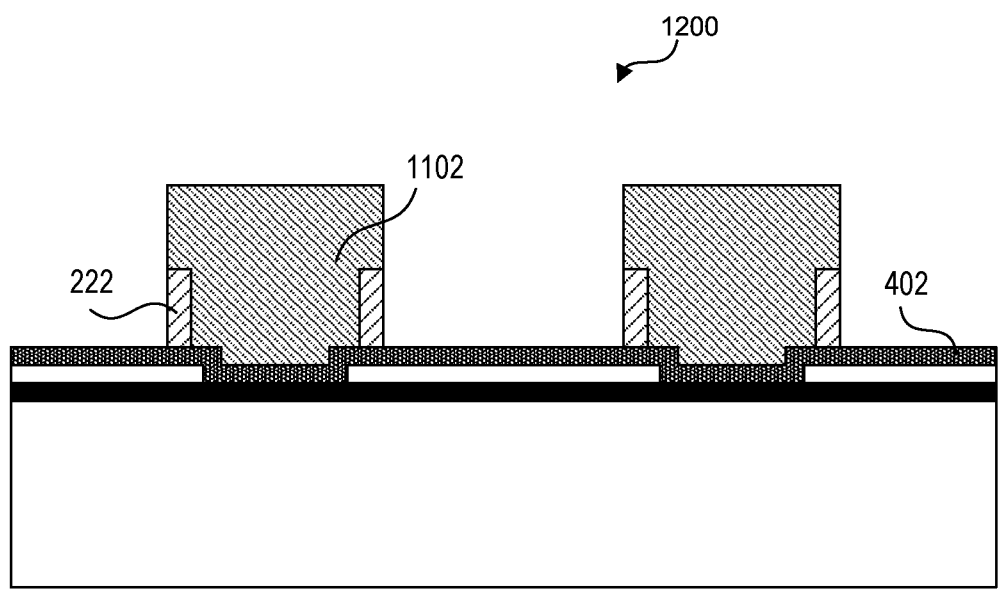

FIG. 12 illustrates a phase 1200 for removing the second PR 902 of FIG. 11. The PR removal can be similar to phase 800, such as via a wet etching process. Accordingly, the deposited core material 1102 and portions of the seed layer 402 extending beyond lateral edges of the deposited core material 1102 and/or the peripheral walls 222 may be exposed. In some embodiments, a top portion/surface of the peripheral walls 222 can be covered by the deposited core material 1102, and outer vertical surface of the peripheral walls 222 can be exposed by the removal of the second PR 902. In other embodiments, the top portion/surface of the peripheral walls 222 may be exposed by removal of the second PR 902.

Figure 13:
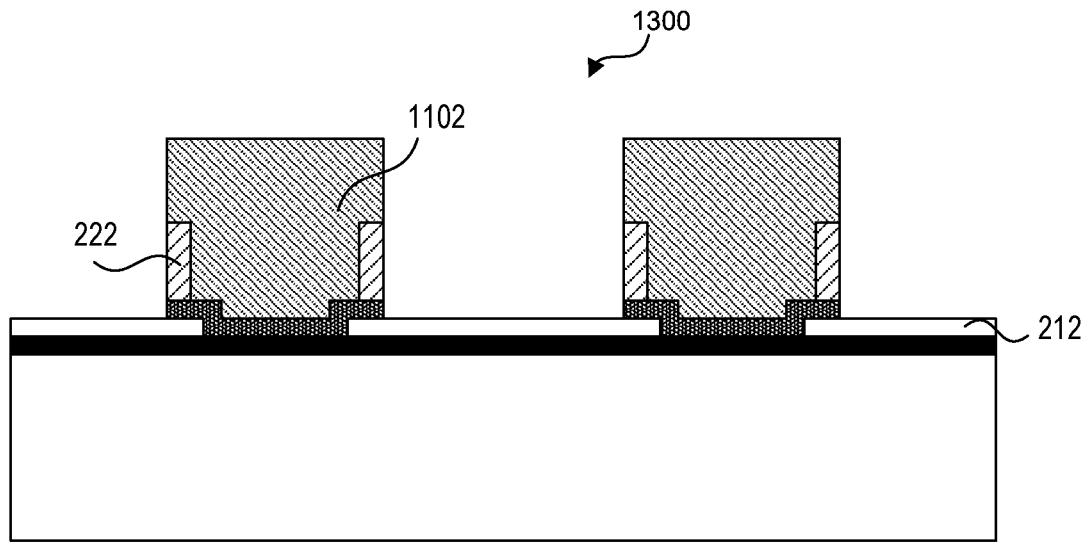

FIG. 13 illustrates a phase 1300 for removing exposed portions of the seed layer 402 of FIG. 12. For example, phase 1300 can include a wet etching process that uses a solvent to dissolve and remove the exposed portions of the seed layer 402. The portions of the seed layer 402 remaining undissolved or remaining under the deposited core material 1102 and/or the peripheral walls 222 can form or serve as the UBM 214 of FIG. 2A. Accordingly, previously covered portions of the solder resist 212 can be exposed based on the removal of the corresponding portions of the seed layer 402.

Figure 14:
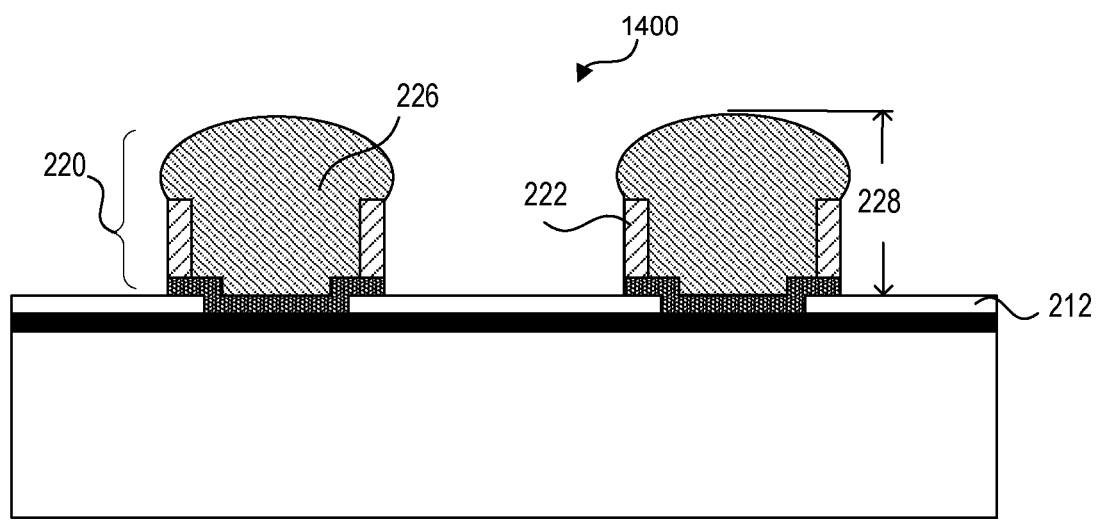

FIG. 14 illustrates a phase 1400 for forming the inner-core 226. For example, the inner-core 226 can be formed by adjusting the deposited core material 1102 of FIG. 13, such as by a reflow process. In some embodiments, the solder can be reflowed based by applying heat to the deposited core material 1102. The solder can adhere to the inner and/or top surfaces of the peripheral walls 222. The solder can form a top portion having a shape (e.g., a dome shape) according to the adherence, the surface tension, and/or other characteristics of the deposited core material 1102. Some excess amounts of the deposited core material 1102 may flow down and onto the solder resist 212. The reshaped remaining portion of the deposited core material 1102 can form the inner-core 226. The resulting inner-core 226 can have the core height 228 extending above or away from the solder resist 212.

Figure 15:
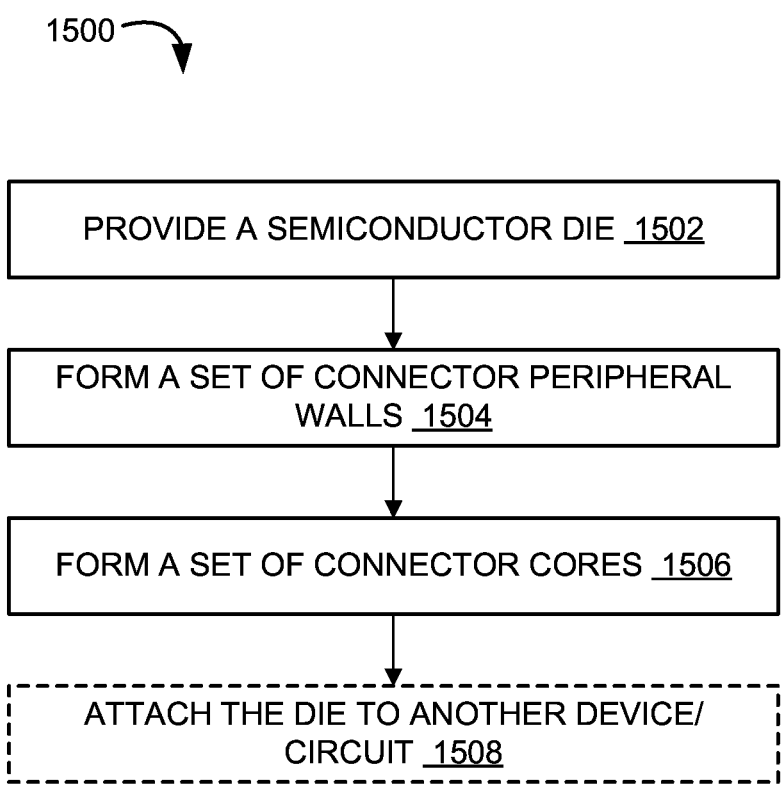
FIG. 15 is a flow diagram illustrating an example method of manufacturing an apparatus in accordance with an embodiment of the present technology.

FIG. 15 is a flow diagram illustrating an example method 1500 of manufacturing an apparatus (e.g., the semiconductor assembly 200 of FIG. 2A, the first semiconductor device 202 of FIG. 2A, the second semiconductor device 204 of FIG. 2A, the continuous-core connector 220 of FIG. 2A, a corresponding system/device, or a combination thereof) in accordance with an embodiment of the present technology. The method 1500 can correspond to the phases described above and illustrated in FIGS. 3-14.

At block 1502, a semiconductor die (e.g., the first semiconductor device 202 of FIG. 2A and/or the second semiconductor device 204 of FIG. 2A) can be provided. The provided die can have an interface surface (e.g., the UBM 214 of FIG. 2A) configured to communicate signals in and/or out of the circuits on the provided die. In some embodiments, providing the semiconductor die can include forming and/or manufacturing the semiconductor die or a portion thereof. Block 1502 can correspond to the phase 300 of FIG. 3 and/or the phase 400 of FIG. 4.

At block 1504, a set of peripheral connector walls (e.g., the peripheral walls 222 of FIG. 2A) may be formed on the semiconductor die. Forming the set of peripheral connector walls can correspond to phases 500 of FIG. 5, 600 of FIG. 6, 700 of FIG. 7, and/or 800 of FIG. 8. For example, forming the set of peripheral connector walls can include coating the first PR 502 of FIG. 5, forming the forming openings 602 of FIG. 6, depositing and/or plating conductive material in the wall-forming openings 602, and/or removing the first PR 502.

At block 1506, a set of connector cores (e.g., the inner-cores 226 of FIG. 2A) may be formed. Forming the set of connector cores can correspond to phases 900 of FIG. 9, 1000 of FIG. 10, 1100 of FIG. 11, 1200 of FIG. 12, 1300 of FIG. 13, and/or 1400 of FIG. 14. For example, forming the set of connector cores can include coating the second PR 902 of FIG. 9, forming the core-forming openings 1002 of FIG. 10, depositing the core material 1102 of FIG. 11, removing the second PR 902, removing exposed portions of the seed layer 402 of FIG. 12, and/or adjusting the deposited core material 1102.

At block 1508, the semiconductor die may be attached to an external device/circuit (e.g., the second semiconductor device 204 of FIG. 2A and/or the substrate 206 of FIG. 2A). For example, the first semiconductor device 202 can be placed over the external device with the set of connector cores aligned over connection interfaces (e.g., pads) on the external device. The inner-core 226 can be reflowed, such as by heating the inner-core 226. After reflowing, the inner-core 226 can structurally attach the semiconductor die to the external device. Further, the inner-core 226 can provide an electrical connection between the attached devices.

Figure 16:
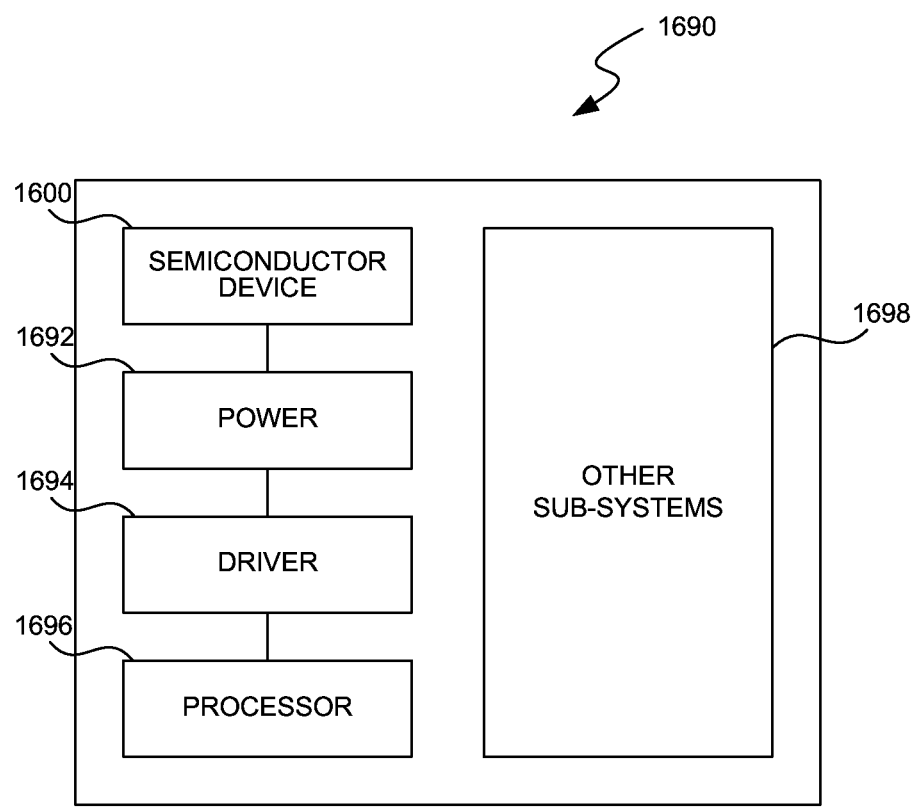
FIG. 16 is a schematic view of a system that includes an apparatus configured in accordance with embodiments of the present technology.

FIG. 16 is a schematic view of a system that includes an apparatus in accordance with embodiments of the present technology. Any one of the semiconductor devices described above with reference to FIGS. 2A-15 can be incorporated into any of a myriad of larger and/or more complex systems, a representative example of which is system 1690 shown schematically in FIG. 16. The system 1690 can include a semiconductor device 1600 ("device 1600") (e.g., a semiconductor device, package, and/or assembly), a power source 1692, a driver 1694, a processor 1696, and/or other subsystems or components 1698. The device 1600 can include features generally similar to those devices described above. The resulting system 1690 can perform any of a wide variety of functions, such as memory storage, data processing, and/or other suitable functions. Accordingly, representative systems 1690 can include, without limitation, handheld devices (e.g., mobile phones, tablets, digital readers, and digital audio players), computers, and appliances. Components of the system 1690 may be housed in a single unit or distributed over multiple, interconnected units (e.g., through a communications network). The components of the system 1690 can also include remote devices and any of a wide variety of computer-readable media.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein, and the invention is not limited except as by the appended claims.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the terms "comprising," "including," and "having" are used throughout to mean including at least the recited feature(s) such that any greater number of the same feature and/or additional types of other features are not precluded. Reference herein to "one embodiment," "an embodiment," "some embodiments" or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

What is claimed is:

1. A semiconductor device, comprising:
a semiconductor die having an interface surface; and
a connector protruding from the interface surface, the connector including:
a peripheral wall on the interface surface and having a wall height measured along a direction orthogonal to the interface surface, wherein the peripheral wall includes an electrically conductive material, and
a solder core encircled by the peripheral wall and having a core height measured along the direction orthogonal to the interface surface, wherein:
the solder core directly contacts the interface surface for reducing stress within the semiconductor die,
the core height is greater than the wall height, and
the solder core functions together with the peripheral wall to provide an electrical connection to the semiconductor die.

2. The semiconductor device of claim 1, wherein the solder core includes tin, silver, lead, or a combination thereof.

3. The semiconductor device of claim 1, wherein the electrically conductive material comprises copper or nickel.

4. The semiconductor device of claim 1, wherein the connector is a first connector of a plurality of such connectors.

5. The semiconductor device of claim 1, wherein the semiconductor die includes inter-layer dielectrics having dielectric constant less than 3.9.

6. The semiconductor device of claim 1, wherein:
the semiconductor die includes:
- a connection layer configured to route electrical signals within the semiconductor device, and
- under-bump metallization (UBM) directly contacting a portion of the connection layer, wherein the UBM is configured to provide an interface for externally communicating one or more electrical signals.

7. The semiconductor device of claim 6, wherein at least a portion of the peripheral wall is directly over and contacts the UBM.

8. The semiconductor device of claim 6, further comprising:
a device substrate attached to the semiconductor die, the device substrate including a pad, wherein:
the solder core directly contacts the pad opposite the UBM.

9. The semiconductor device of claim 1, wherein the solder core protrudes past a distal edge of the peripheral wall away from the interface surface.

10. The semiconductor device of claim 9, wherein a portion of the solder core protruding past the distal edge of the peripheral wall has a dome shape.

11. The semiconductor device of claim 9, wherein a portion of the solder core protruding past the distal edge of the peripheral wall overhangs the peripheral wall.

12. The semiconductor device of claim 1, wherein the peripheral wall has generally circular cross-sectional shape and defines a cylindrically shaped inner space filled by the solder core.

13. A semiconductor package, comprising:
a semiconductor die having an interface surface;
a set of connectors protruding from the interface surface, wherein each connector in the set of connectors includes:
- a peripheral wall on the interface surface and having a wall height measured along a direction orthogonal to the interface surface, wherein the peripheral wall includes an electrically conductive material, and
- a solder core encircled by the peripheral wall and having a core height measured along the direction orthogonal to the interface surface, wherein:
  the solder core directly contacts the interface surface for reducing stress within the semiconductor die,
  the core height is greater than the wall height, and
  the solder core functions together with the peripheral wall to provide an electrical connection to the semiconductor die; and
a substrate having a pad attached to the solder core, wherein the substrate includes circuits electrically coupled to circuits in the semiconductor die.

14. The semiconductor package of claim 13, wherein the peripheral wall is rigid and inflexible at room temperature.

15. The semiconductor package of claim 14, wherein the wall height is less than or equal to a minimum separation distance between the semiconductor die and the substrate.

16. The semiconductor package of claim 14, wherein the peripheral wall includes copper, nickel, or a combination thereof.

17. The semiconductor package of claim 13, wherein:
the semiconductor die is a first die; and
the substrate is a second die.

18. A method of manufacturing a semiconductor device, the method comprising:
providing a semiconductor die having an interface surface;
forming a peripheral connector wall on the interface surface, wherein the peripheral wall includes an electrically conductive material and extends away from the interface surface by a wall height; and
forming a solder core within and protruding above the peripheral connector wall, wherein the solder core directly contacts the interface surface.

19. The method of claim 18, further comprising:
connecting the semiconductor chip to a device substrate based on reflowing the solder core.

20. The method of claim 18, wherein the peripheral connector wall comprises copper or nickel.

* * * * *